United States Patent
Davis et al.

(10) Patent No.: US 6,866,460 B2
(45) Date of Patent: Mar. 15, 2005

(54) APPARATUS AND METHOD FOR LOADING OF CARRIERS CONTAINING SEMICONDUCTOR WAFERS AND OTHER MEDIA

(75) Inventors: Jeffry Alan Davis, Kalispell, MT (US); Andro Ardiano Purnomohadi, Kalispell, MT (US); Daniel Thomas Potter, Columbia Falls, MT (US)

(73) Assignee: Semitool, Inc., Kalispell, MT (US)

( * ) Notice: Subject to any disclaimer, the term of this patent is extended or adjusted under 35 U.S.C. 154(b) by 102 days.

(21) Appl. No.: 10/185,773

(22) Filed: Jun. 27, 2002

(65) Prior Publication Data

US 2003/0012623 A1 Jan. 16, 2003

Related U.S. Application Data

(60) Provisional application No. 60/306,005, filed on Jul. 16, 2001.

(51) Int. Cl.$^7$ ................................................. B65G 1/00
(52) U.S. Cl. ...................... 414/217; 414/939; 414/940
(58) Field of Search ................................. 414/217, 805, 414/939, 940

(56) References Cited

U.S. PATENT DOCUMENTS

| | | | | |
|---|---|---|---|---|
| 5,715,929 A | * | 2/1998 | Scheler et al. | 198/375 |
| 5,947,677 A | * | 9/1999 | Matsushima et al. | 414/609 |
| 6,014,817 A | * | 1/2000 | Thompson et al. | 34/60 |
| 6,409,448 B1 | * | 6/2002 | Sindledecker | 414/222.04 |
| 6,413,356 B1 | * | 7/2002 | Chokshi et al. | 156/345.32 |
| 6,447,232 B1 | * | 9/2002 | Davis et al. | 414/217.1 |

* cited by examiner

Primary Examiner—James R. Bidwell
(74) Attorney, Agent, or Firm—Perkins Coie LLP

(57) ABSTRACT

An apparatus for loading media carriers into a processing chamber, including a pivoting arm mechanism which accepts a carrier in at a lower position, locks it on the arm, and provides a power-assisted movement of the carrier lifting it into an upper position proximate the opening to the processing chamber, where the arm is locked in place, with the carrier then pushed along a ramp on the arm directly into the processing chamber.

22 Claims, 7 Drawing Sheets

APPARATUS AND METHOD FOR LOADING OF CARRIERS CONTAINING SEMICONDUCTOR WAFERS AND OTHER MEDIA

This application claims priority to provisional application Ser. No. 60/306,005 filed Jul. 16, 2001 hereby incorporated by reference.

BACKGROUND OF THE INVENTION

The field of the present invention relates to apparatus used in the fabrication process for semiconductor wafers, substrates, flat panel displays and other flat media, and more particularly to centrifugal processing systems with rotors adapted to receive carriers which hold wafers or other semiconductor articles or flat media, and associated transfer implements and methods for facilitating the transfer of media carriers to and from the rotor.

Wafers are typically processed in batches. For example, in manufacturing semiconductor chips, for use in computers, telephones, televisions, and other electronic products, silicon wafers will undergo many batch processing steps, such as oxidation, photolithography, diffusion, chemical vapor deposition, metallization and etching. Batch handling may occur throughout the entire production process, or for one or more processing steps or related handling operations. Batch processing of this type almost always utilizes some type of carrier or container to hold the wafers being processed.

A wafer carrier, cassette or container holds a group of wafers. The wafer carriers can be of various designs. In many applications, they are made of a suitable polymeric material, e.g., polypropylene or TEFLON® fluoropolymer. The sides and sometimes the bottom of the wafer carrier have receiving slots formed to receive and hold the wafers in a spaced array with the faces of the wafers adjacent to one another. Typically, the central axes of the wafers are aligned. The wafers are slid into the carrier or container, such as from the side or above, and are removed by sliding them outwardly. The receiving slots are shallow so that the wafer is engaged only at the peripheral edges and along a thin marginal band extending inwardly from the periphery. The term "carrier" referred to below means a carrier, a holder, a wafer boat, or a cassette.

Various of these batch processing steps during fabrication of semiconductor components involve the application of processing liquids and gases to the articles being processed. The application and removal of these processing fluids to and from the exposed surfaces of the wafers are enhanced by movement of the wafers within the processing chamber. Processing may be enhanced by centrifugal action of the semiconductor wafers which improves movement of fluids across the wafer surfaces, such as when liquids are sprayed upon the wafer and then moved across the wafer surfaces due to centrifugal forces acting upon the liquids as the wafers spin.

In one example, after semiconductor wafers have been cleaned, they must be dried because water that remains on the surface of a semiconductor wafer has at least some potential of leaving some form of residue which may interfere with subsequent operations or cause defects in the resulting products. Centrifugal action aids in the removal of water and other processing liquids so that such residues are not as likely to occur because the fluid is applied to the surface and then moves outwardly and is removed from the surfaces. Drying is also enhanced because less liquid remains on the wafer surfaces, so drying speed is increased.

In one type of prior art centrifugal processor, wafers are put into a holder or carrier in a spaced array around an axis of rotation. The carrier is lifted and loaded into a rotor. The rotor is then rotated within a processing chamber which is typically enclosed within a processing bowl or vessel. In the center of the vessel and at other peripheral locations are fluid manifolds with spray nozzles or similar outlets that are connected to a source of deionized water, heated nitrogen, or other processing chemicals, both liquids and/or gases. These or other processing fluids are thus applied to the wafers to effect washing, drying or other processing.

Certain processing tools, such as a spin rinser dryer, have been built for drying batches of wafers held in a single wafer carrier. The rotor has an opening for receiving the carrier. The carrier is loaded with wafers and loaded carrier is lifted into position and inserted into the rotor.

Thus in certain steps during the fabrication process, a carrier loaded with media needs to be inserted into the rotor of the processing chamber. There are primarily two methods used for lifting the loaded carrier and inserting it into the rotor. The first method is an operator manually lifting the loaded carrier, orienting it at the correct height position, rotational position, and tilt angle and then translating the loaded carrier into the rotor. The second method comprises a robotic arm which is programmed to automatically lift the loaded carrier, orient it at the correct height position, rotational position, and tilt angle and then translate it into the rotor.

However, robotic arm systems can be quite complicated and expensive. Particularly for processing tools built for batches of wafers held in a single media carrier, a robotic arm may not be practical. In addition, many single carrier processing machines as well as multiple carrier machines are still manually loaded by fabrication plant workers. Particularly when fully loaded with wafers, these carriers can be quite bulky and heavy. Thus there is need for improved and alternate systems for loading carriers into a processing machine.

Moreover, manually positioning a fully loaded carrier at the right height, tilt angle and rotational position can be time consuming, difficult, and involves risk of breaking wafers. Accordingly, there is a need for an improved processor loading apparatus and method.

SUMMARY OF THE INVENTION

To this end, an apparatus for loading flat media carriers into a batch processing chamber, such as rotor rotatably mounted within the chamber, includes a pivoting arm mechanism which accepts a carrier in a first (lower) position. The arm provides a list-assisted movement carrier lifting the carrier into a second (upper) position. The carrier may be readily moved off of the arm and into the processing chamber.

BRIEF DESCRIPTION OF THE DRAWINGS

Other objects and features will become apparent from the following detailed description taken in connection with the accompanying drawings. However, the drawings are provided for purpose of illustration only, and are not intended as a definition of the limits of the invention.

In the drawings, wherein the same reference numbers denote the same elements throughout the several views.

DETAILED DESCRIPTION OF THE DRAWINGS

The words "media" or "wafer" here mean a wafer, photomask, memory disk, screen, or other flat object or workpiece, made of a semiconductor or a non-semiconductor material.

The word "carrier" means a cassette, a carrier, or other container or holder of flat media.

Figure 1:
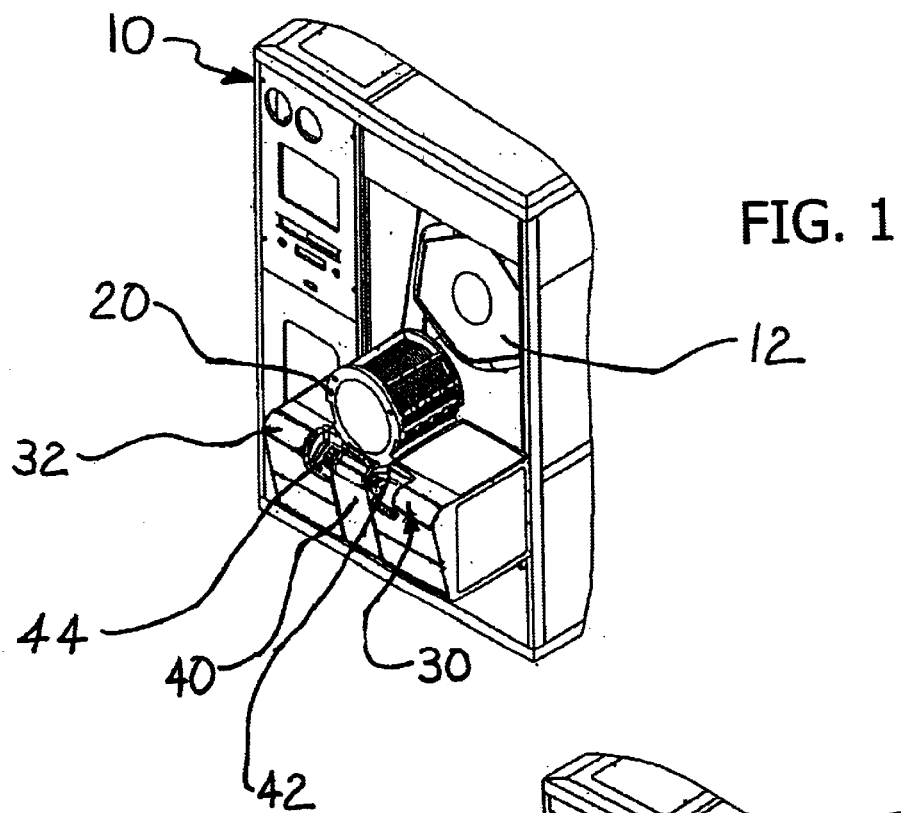
FIGS. 1–4 are perspective views of an operation of a preferred apparatus and method for loading a media carrier into a processing chamber according to a preferred embodiment, whereby in FIG. 1 the carrier is inserted onto the loading arm mechanism, in FIG. 2 the door to the chamber is opened, in FIG. 3 the arm is raised to position the carrier proximate the chamber opening, and in FIG. 4 the carrier is moved into the chamber.
Figure 2:
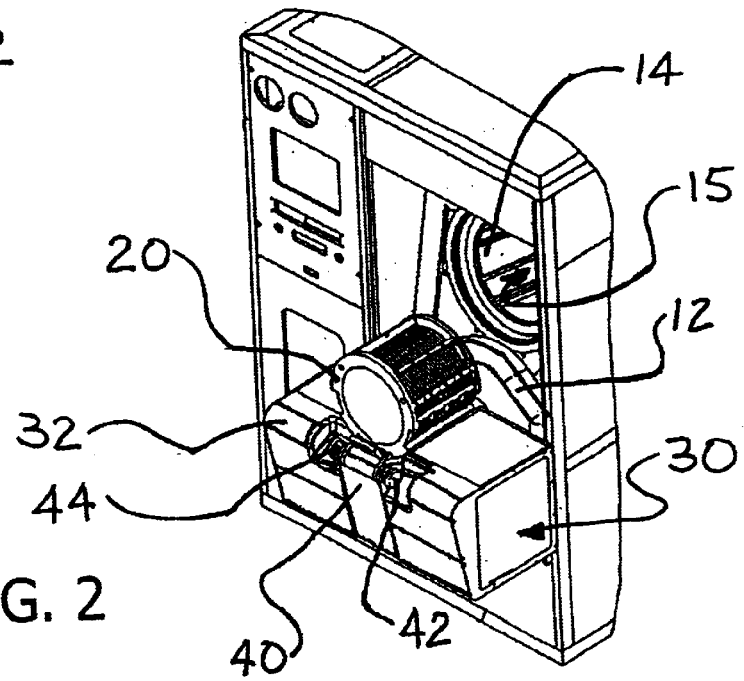
Figure 3:
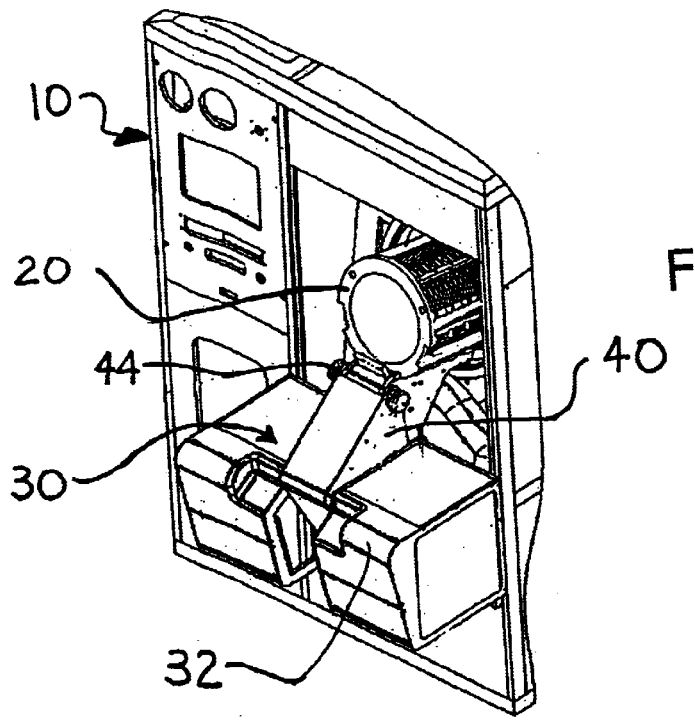
Figure 4:
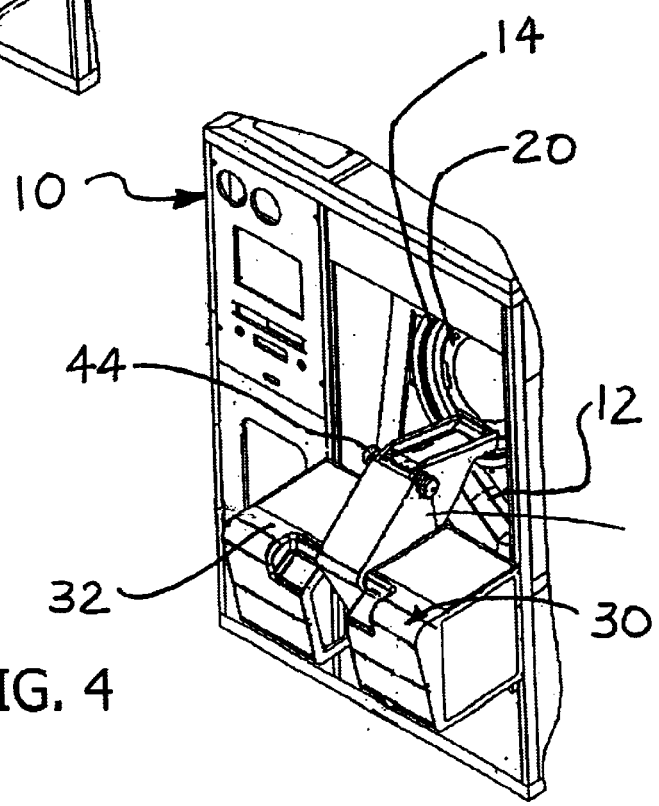
Figure 5:
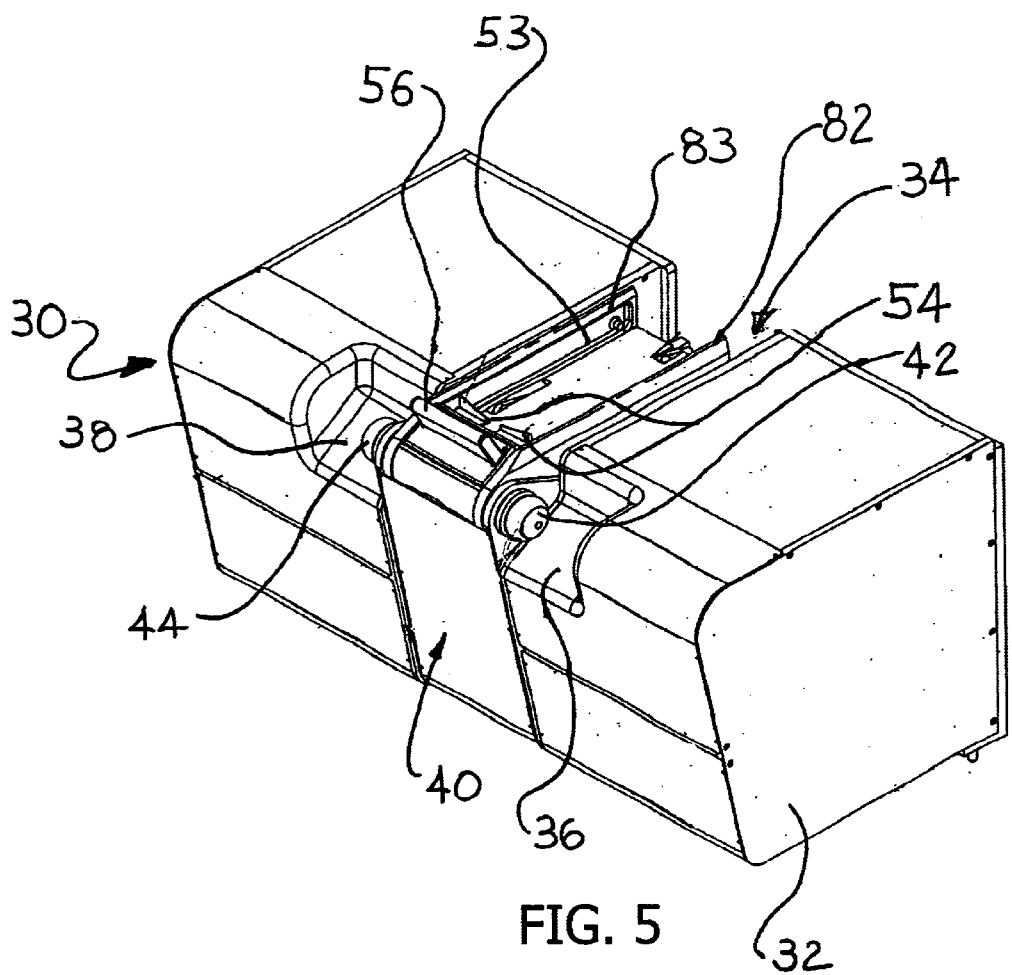
FIG. 5 is a detailed perspective view of the loading arm apparatus of FIGS. 1–4 with the arm in the lowered position without any carrier.

Turning now in detail to the drawings, FIGS. 1–4 illustrate an operation of a preferred method and semi-automatic or manual assist loading apparatus 30 for loading a media carrier 20 into a chamber of a process tool 10 according to a preferred embodiment. In FIG. 1 the loading apparatus 30 includes a housing section 32 and an arm mechanism 40, the arm mechanism 40 being in the lowered position with the carrier 20 inserted thereon. The door 12 to the processing chamber is closed preventing contaminants from entering. In FIG. 2 the door 12 to the processing chamber is opened showing the rotor 14 within the processing chamber. The rotor 14 has an inner rotor chamber 15 for accepting the carrier 20. By grasping the handles 42 and 44, the operator raises the arm mechanism 40 to the raised position as shown in FIG. 3 for positioning the carrier 20 proximate the chamber opening. In FIG. 4 the carrier 20 is moved into the rotor chamber 15. Once the carrier 20 is inserted into the rotor 14, the carrier 20 is released from the arm mechanism 40 and the arm mechanism is returned to the lowered position and the door 12 to the processing chamber is closed.

After the tool 10 completes the process on the loaded carrier, the door 12 is opened, the loading arm mechanism 40 is raised with the loaded carrier 20 retrieved from the chamber by reversing the above-described loading steps.

FIGS. 5–10 illustrate details of the loading apparatus 30 and its operation. The apparatus 30 includes a housing section 32 and an arm section 40. The housing section 42 is preferably mounted to the tool 10 as in FIGS. 1–4 or may be alternately be free-standing, supported by the floor. The apparatus may be designed integral with a tool, or may comprise a separate unit. The apparatus may be retrofitted to an existing tool or integrated with a new tool.

The housing 32 has a central open section 34 within which the loading arm mechanism 40 is pivotally mounted as described below. The housing section 32 also has a pair of indented sections 36, 38 for facilitating access to the arm handles 42, 44.

The arm section 40 includes an upper linkage section 50 pivotally mounted to a lower linkage section 60 via the rod between handles 42, 44. The lower linkage section 60 is pivotally supported onto a rod 66 which is mounted to the housing 32. A gas spring 72 is pivotally mounted on one end to a rod 70 and on a second end to the rod between handles 42, 44.

The upper linkage section 50 includes a ramp section 80 including slide rails 82, 83 and a slider handle 56. The slider handle 56 includes a lever 57 which when pivoted actuates the position of hooks 54, 54 between a locking and unlocking position. The hooks 54, 54 serve as connecting elements for engaging and releasably connecting the lever to the media carrier. The carrier 20 includes a notch 22 in its outer periphery. The carrier 20 is lifted and placed onto the arm mechanism with the notch 22 oriented downwardly and spanning the rails 82, 83 (as in the position of FIG. 6). Thus the notch 22 and rails 82, 83 serve as an alignment mechanism for ensuring that the carrier 20 is aligned in the proper orientation when the carrier 20 is placed on the arm mechanism 40. When the carrier 20 is placed on the rails 82, 83, the hooks 54, 54 engage the carrier 20 holding it in position engaged to the slider handle 56. The lever 57 is connected to a hook mechanism which operates the hooks 54 for retaining/releasing the carrier 20 during the motion into and out of the rotor 14.

Figure 6:
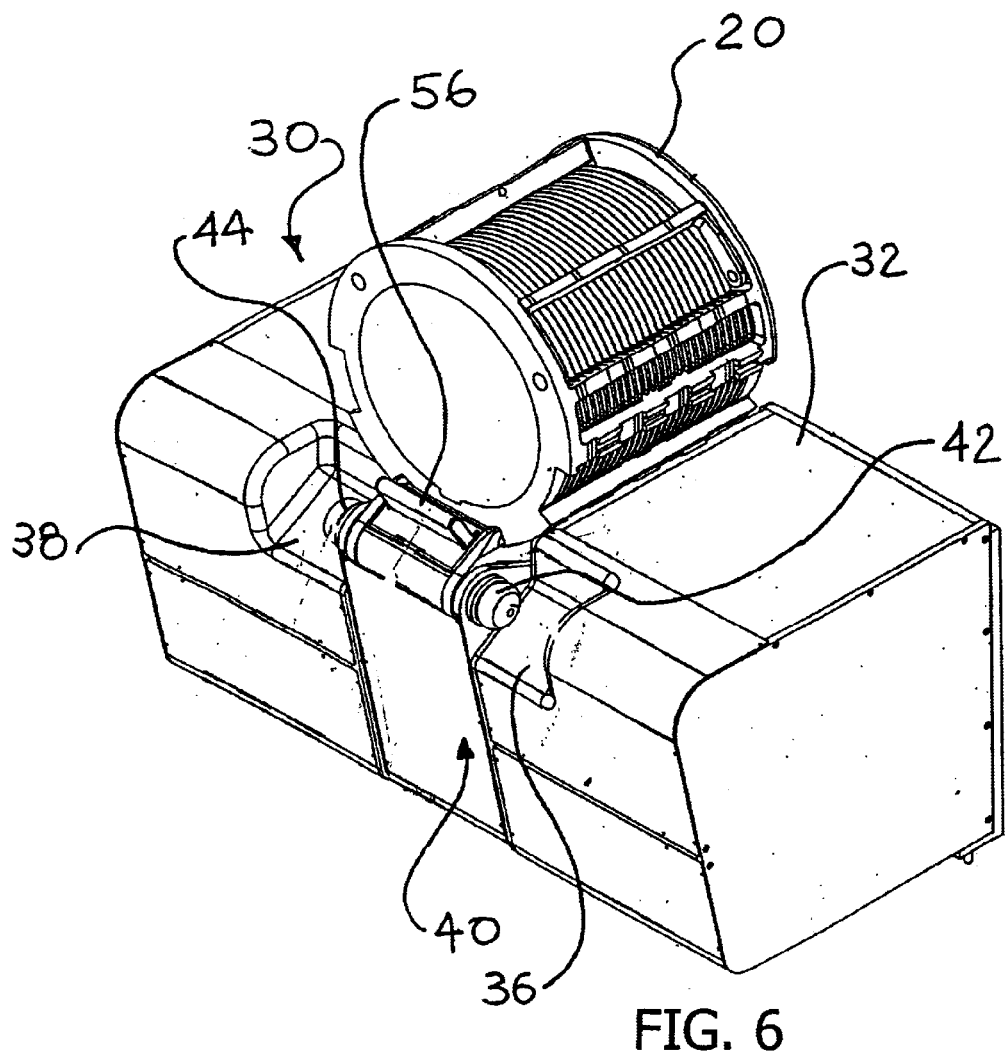
FIG. 6 is a perspective view of the apparatus of FIG. 5 bearing a carrier with the arm in the lowered position as in FIG. 2.

In a preferred construction, the lever 57 is spring-loaded, automatically moving the hooks 54, 54 into the engaging position for retaining the carrier 20 when (a) the carrier 20 is initially placed onto the ramp 80 as in FIG. 6 or (b) when the slider handle 56 is moved into contact with the carrier 20 to engage the carrier 20 for removal from the chamber.

The slider handle 56 slides along ramp 80 for pushing the carrier 20 along the rails 82, 83 and into the rotor 14. The lateral sides of the slider handle 56 engage and slide along tracks 52, 53 below the rails 82, 83. Alternately, the slider handle 56 may include a female slide engaging a monorail along the center of the ramp 80. Alternately, the rails 82, 83 may comprise bearings or rollers for minimizing friction during travel of the media carrier and/or slider handle 56 along the ramp.

The upper linkage section 50 is supported by a linkage 58 which is pivotally connected at one end to a bracket 59 on housing 32 the housing and on the other end to a rod 51 disposed between side panels of the upper linkage 50.

An arm locking mechanism is provided for releasably locking the arm in each of the first and second positions. An arm 62 is attached at a top end to a knob 63 next to handle 42 and includes at its lower end a pivotally attached spring-loaded detent mechanism 64 which selectively engages one of two notches 68a, 68b on the disk 68 mounted on rod 66. When the arm is in the upper position as in FIGS. 7–10, the detent mechanism 64 is locked in position within the notch 68a and when the arm is in the lower position as in FIGS. 5–6, the detent mechanism 64 is locked in position within the notch 68b. In order to unlock the arm so that it may be moved between the raised and lowered positions, the knob 63 is rotated about 10° (clockwise in the view of FIG. 10) to raise the detent mechanism 64 out of the notch 68a or 68b.

Figure 7:
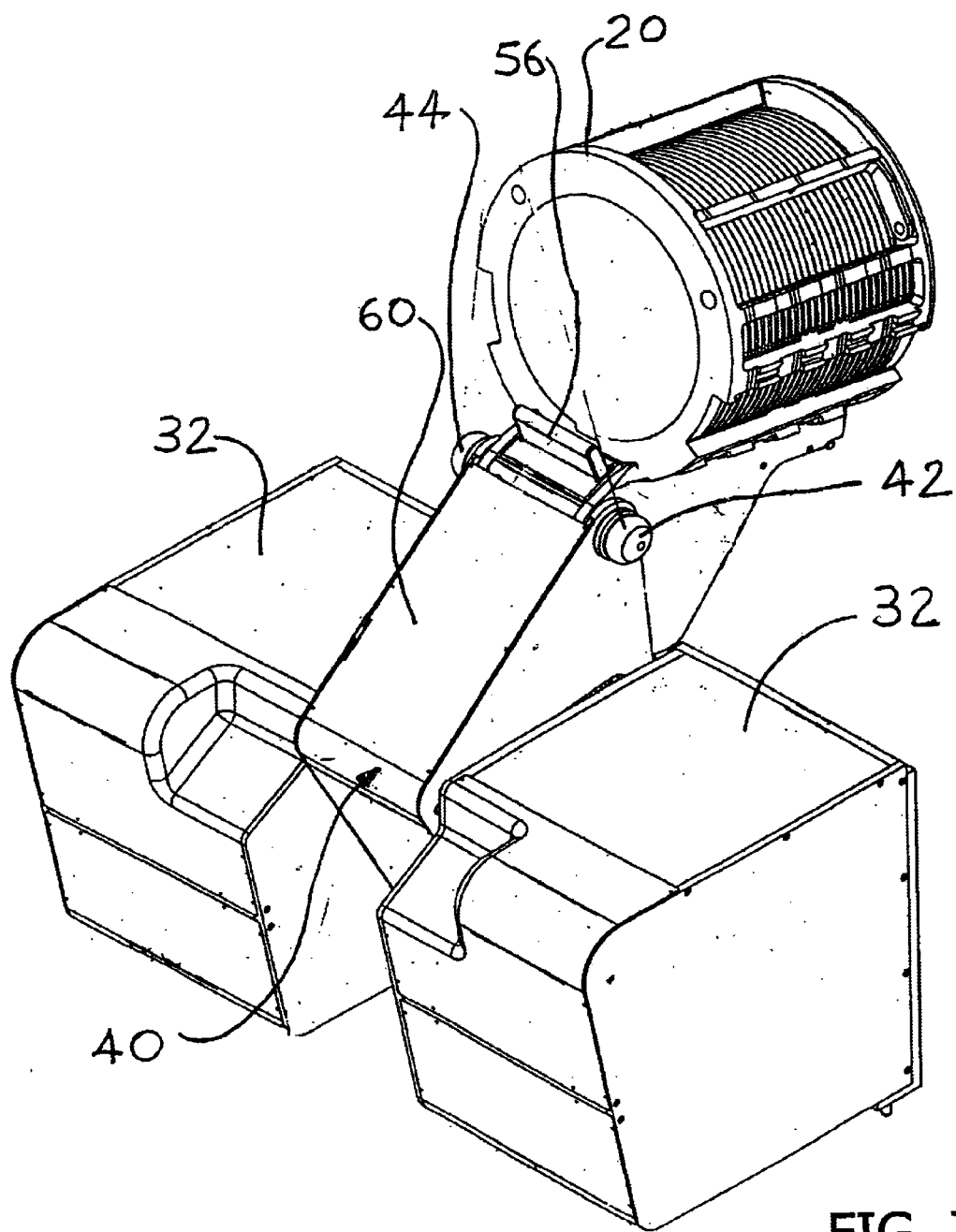
FIG. 7 is a perspective view of the apparatus of FIG. 6 bearing a carrier with the arm in the raised position as in FIG. 3.
Figure 9:
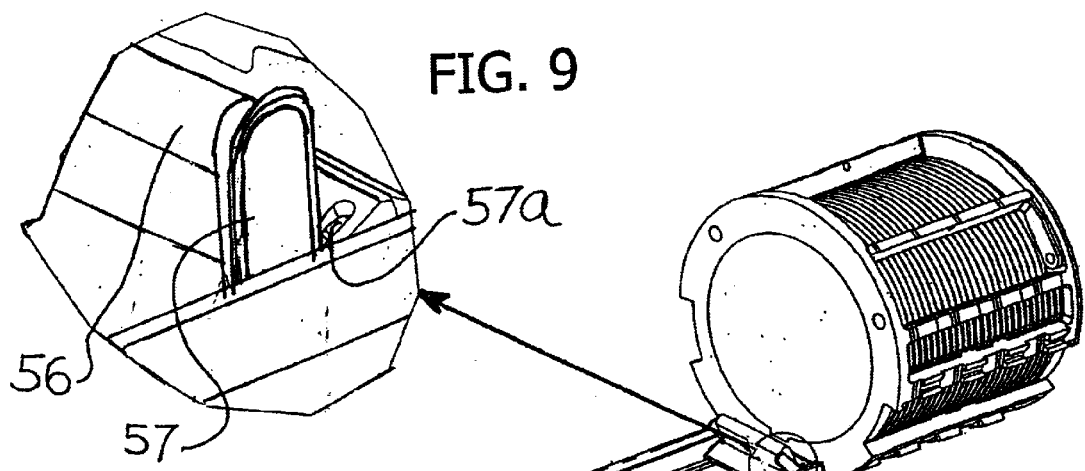
FIG. 9 is a detailed perspective view of the locking handle of the arm mechanism of FIG. 8.
Figure 8:
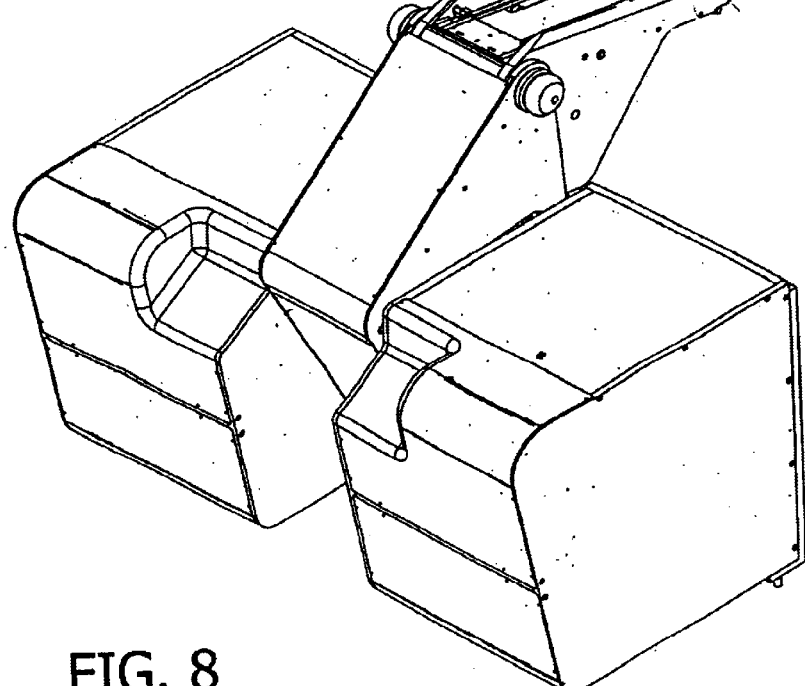
FIG. 8 is a perspective view of the apparatus of FIG. 7 bearing the carrier with the arm in the raised position with the carrier moved to the insertion position as in FIG. 4.
Figure 10:
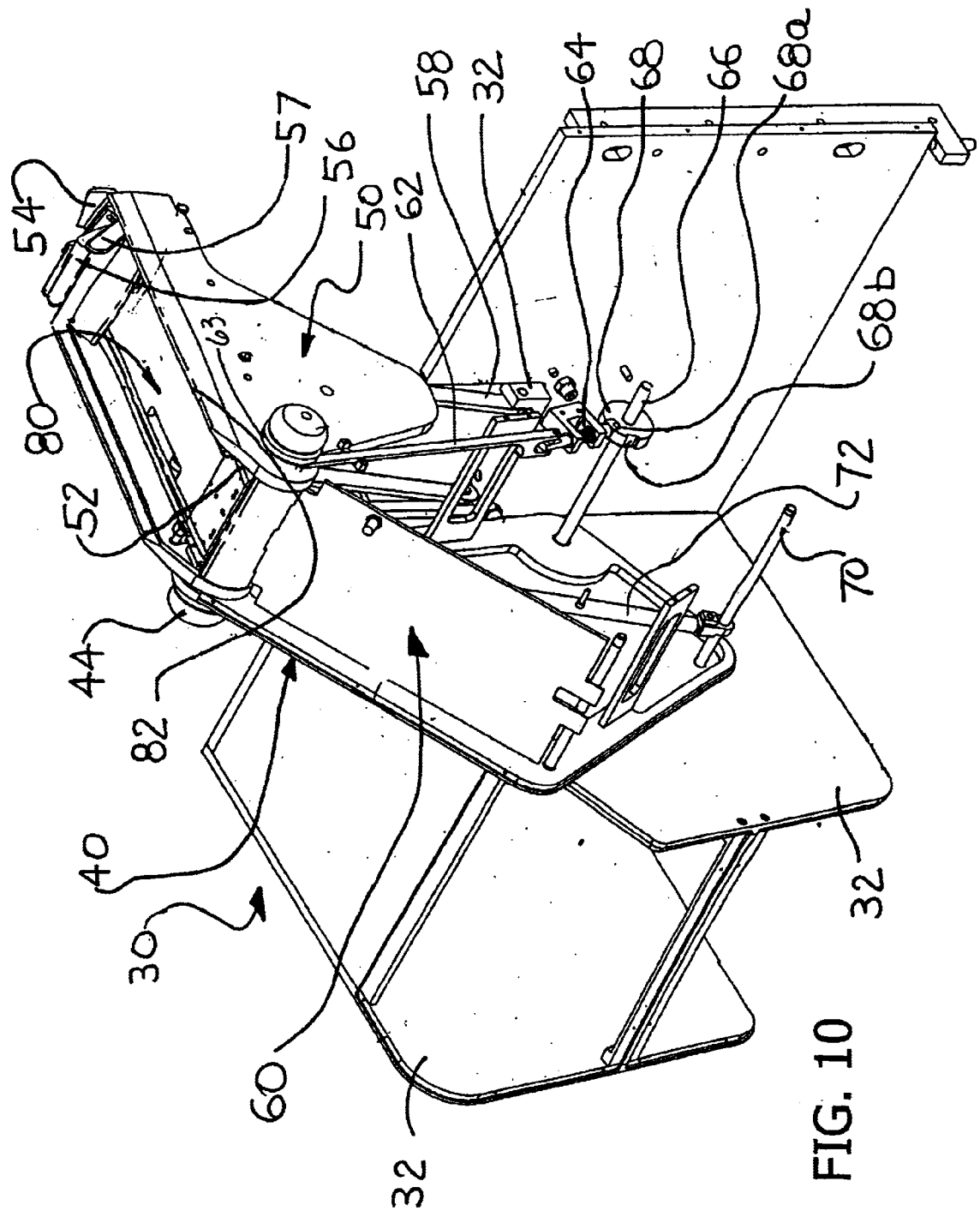
FIG. 10 is a partial cutaway of detailed perspective view of the loading mechanism of FIGS. 5–9.

The operation of loading the carrier 20 into the rotor 14 may be accomplished by the preferred steps of:

opening the chamber door 12;

lifting the carrier 20 over the ramp section 80;

orienting the carrier 20 to position the notch 22 over the rails 82, 83 and placing it on the ramp section 80 of the loader mechanism 40;

securing the carrier to the slider handle by engaging the front of the carrier 20 with locking hooks 54;

grasping the lifting handles 42, 44 and rotating the knob 63 to unlock the detent mechanism 64 from the notch 68b;

lifting the loader arm via handles 42, 44 to pivot the loader mechanism 40, with the carrier 20 attached thereon, from the first position as in FIG. 6 to the second position as in FIG. 7;

releasing the knob 63 and allowing the detent mechanism to engage notch 68a thereby locking the loader arm in the second position, the carrier 20 being positioned at the desired height, tilt angle, and rotational position for insertion into the rotor chamber 15;

grasping the slider handle 56 and pushing the slider handle 56 along the track 53 toward the rear of the ramp section 80 thereby moving the carrier 20 into the rotor chamber 15 (moving from the position in FIG. 7 to the position in FIG. 8);

actuating the lever 57 within the notch 57a (see FIG. 9) to retract the hooks 56 thereby releasing the carrier 20 within the rotor chamber 15;

sliding the slide handle 56 back to the front of the ramp 80 (i.e. to a position as in FIG. 7);

rotating the knob 63 to release the detent mechanism 64 from the notch 68a;

manipulating the handles 42, 44 to return the arm mechanism to the lower position;

closing the chamber door 12.

Once the process step in the tool has been completed, the above steps may be reversed thereby assisting in removing the carrier 20 from the tool 10 by the steps of:

opening the chamber door 12;

grasping the lifting handles 42, 44 and rotating the knob 63 to unlock the detent mechanism 64 from the notch 68b;

lifting the loader arm via handles 42, 44 to pivot the loader mechanism 40 from the lower position to the raised position;

releasing the knob 63 and allowing the detent mechanism to engage notch 68a thereby locking the loader arm in the second position;

securing the carrier to the slider handle by engaging the front of the carrier 20 with locking hooks 54;

grasping the slider handle 56 and pulling the slider handle 56 along the track 53 toward the front of the ramp section 80 thereby moving the carrier 20 out of the rotor chamber 15;

rotating the knob 63 to release the detent mechanism 64 from the notch 68a;

manipulating the handles 42, 44 to return the arm mechanism with the carrier thereon to the lower position.

Of course, not all of these preferred steps are necessary, and one or more may be omitted in various applications.

Thus the arm mechanism provides for an effective assist both for positioning as well as lifting a loaded carrier into a processing chamber. The system includes a simple pivoting linkage mechanism which does not require complicated precision robotic arm operation.

In a preferred configuration, the gas spring 72 is sized and loaded to offset the weight of the arm only. Once the carrier 20 is removed, the arm weight is essentially zero via operation of the gas spring 72. Though when the carrier is loaded on the arm, the operator must still provide sufficient manual force on the handles 42, 44 to lift the combined carrier, the lifting operation is greatly eased because the arm provides for all the orientation and positioning. The arm mechanism provides a system and device for orienting the carrier at the correct height position, rotational position, and tilt angle and then for translating the loaded carrier into the rotor.

Alternately, the system and the gas spring may be configured to provide greater lifting force to provide some carrier lifting assistance to the operator.

Other lifting force mechanism may be used such as an electric or pneumatic motor for moving the arm between the two positions, or a compressor for charging/discharging the gas spring.

Thus, novel carrier loading systems and methods have been shown and described. Various modifications and substitutions of equivalents may, of course, be made without departing from the spirit and scope of the invention.

What is claimed is:

1. An apparatus for assisting an operator in loading media carriers into a processing chamber, comprising:

an arm including a ramp section for accepting a media carrier, the arm pivotally translatable between a lower position for accepting the media carrier, and an upper position where said ramp section is adjacent to an opening of the processing chamber; and a lifting force mechanism connected to the arm for providing a lifting force to assist movement of the arm from the lower position to the upper position.

2. An apparatus according to claim 1 wherein said lifting force mechanism comprises a gas spring.

3. An apparatus according to claim 2 further comprising a compressor for charging said gas spring.

4. An apparatus according to claim 1 wherein said lifting force mechanism exerts a lifting force exceeding the weight of the arm.

5. An apparatus according to claim 1 wherein said lifting force mechanism is selected from the group consisting of: an electric motor, or a pneumatic motor.

6. An apparatus according to claim 1 wherein said ramp section includes slide rails for supporting the media carrier, and when the arm is in the upper position, the media carrier is slidable along said slide rails off of the arm and into the processing chamber.

7. An apparatus according to claim 1 wherein the arm includes an arm locking mechanism for selectively and releasably locking the arm in the upper position.

8. An apparatus according to claim 1 wherein the arm includes an arm locking mechanism for selectively and releasably locking the arm in either the upper position or the lower position.

9. An apparatus according to claim 1 wherein the arm further comprises lifting handles for facilitating lifting by the operator.

10. A method for loading a media carrier into a processing chamber, comprising the steps of:

providing an arm including a ramp section for accepting the media carrier, the arm being pivotally translatable between a lower position where the ramp section is disposed for accepting the media carrier and an upper position where the ramp section is disposed proximate to an opening of the processing chamber;

placing the media carrier onto the arm at the lower position;

lifting the arm from the lower position to the upper position; and sliding the media carrier off of the arm and into the processing chamber.

11. A method according to claim 10 wherein the arm orients the media carrier at a height position, rotational position, and tilt angle to align the media carrier with the processing chamber.

12. A method according to claim 10 further comprising the step of aligning the media carrier in a proper orientation by placing the media carrier onto a ramp section of the arm.

13. A method according to claim 10 further comprising the step of locking the arm in the upper position before allowing the media carrier to be moved into the processing chamber.

14. A method according to claim 10 further comprising the steps of:

releasing the media carrier from the ramp section;

returning the arm from the upper position to the lower position.

15. A method according to claim 14 further comprising removing the media carrier from the processing chamber by the steps of lifting the arm to pivot the arm from the lower position to the upper position;

pulling the media carrier out of the processing chamber and onto the ramp section of the arm;

pivoting the arm from the upper position to the lower position;

removing the media carrier from the arm.

16. A method for loading a media carrier into a processing chamber, comprising the steps of:

providing an arm including a ramp section for accepting the media carrier, the arm being pivotally translatable between a lower position where the ramp section is disposed for accepting the media carrier and an upper position where the ramp section is disposed proximate to an opening of the processing chamber;

opening a door to the processing chamber;

the operator placing the media carrier on the ramp section;

orienting the media carrier on the ramp section;

the operator lifting the arm from the lower position to the upper position;

providing a lifting force to the arm for assisting the operator in lifting the arm and the media carrier from the lower position to the upper position, the arm pivoting to place the media carrier at an orientation wherein the media carrier is at a desired height position, rotational position, and tilt angle for translating the media carrier into the processing chamber;

sliding the media carrier along the ramp section and into the processing chamber;

releasing the media carrier from the ramp section;

pivoting the arm back to the lower position;

closing the door to the processing chamber.

17. An apparatus for assisting an operator in loading media carriers into a processing chamber, comprising:

an arm including a ramp section for accepting a media carrier, the arm pivotally translatable between a lower position for accepting the media carrier, and an upper position where said ramp section is adjacent to an opening of the processing chamber; and a lifting force mechanism connected to the arm for providing a lifting force to assist movement of the arm from the lower position to the upper position, wherein said lifting force mechanism exerts a lifting force on the arm equal to the weight of the arm.

18. An apparatus for assisting an operator in loading media carriers into a processing chamber, comprising:

an arm including a ramp section for accepting a media carrier, the arm pivotally translatable between a lower position for accepting the media carrier, and an upper position where said ramp section is adjacent to an opening of the processing chamber;

a slider handle on the ramp section, the slider handle releasably connectable to the media carrier; and a lifting force mechanism connected to the arm for providing a lifting force to assist movement of the arm from the lower position to the upper position.

19. An apparatus according to claim 18 wherein said slider handle includes a lever and connection elements, the connecting elements being releasably connectable to the media carrier for retaining and releasing the media carrier during motion into and out of the processing chamber.

20. A method for loading a media carrier into a processing chamber, comprising the steps of:

providing an arm including a ramp section for accepting the media carrier, the arm pivotally translatable between a lower position where the ramp section is disposed for accepting the media carrier, and an upper position where the ramp section is disposed proximate to an opening of the processing chamber;

placing the media carrier onto the arm at the lower position;

aligning the media carrier in a proper orientation by engaging a notch on the media carrier with an alignment mechanism on the ramp section;

lifting the arm from the lower position to the upper position; and sliding the media carrier off of the arm and into the processing chamber.

21. A media carrier loading apparatus, comprising:

arm means for accepting and positioning a media carrier for sliding movement into a processing chamber, said arm means including a ramp section that is downwardly sloped toward the processing chamber; and lifting force means for urging the arm means from a lower position to an upper position to assist an operator in moving the arm means between the lower position and the upper position.

22. A media carrier loading apparatus according to claim 21 further comprising a means for releasably securing the media carrier to said ramp section.

* * * * *